(12) United States Patent
Nagaoka et al.

(10) Patent No.: US 9,293,372 B2
(45) Date of Patent: Mar. 22, 2016

(54) WAFER PROCESSING METHOD

(71) Applicant: DISCO CORPORATION, Tokyo (JP)

(72) Inventors: Kensuke Nagaoka, Tokyo (JP); Yuki Ogawa, Tokyo (JP); Tsubasa Obata, Tokyo (JP); Yuri Ban, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/805,037

(22) Filed: Jul. 21, 2015

(65) Prior Publication Data

US 2016/0027696 A1    Jan. 28, 2016

(30) Foreign Application Priority Data

Jul. 28, 2014   (JP) .................................. 2014-152961

(51) Int. Cl.
*H01L 21/78* (2006.01)
*H01L 21/683* (2006.01)
*H01L 21/66* (2006.01)

(52) U.S. Cl.
CPC ............ *H01L 21/78* (2013.01); *H01L 21/6836* (2013.01); *H01L 22/12* (2013.01)

(58) Field of Classification Search
CPC ...... H01L 21/78; H01L 21/6836; H01L 22/12
See application file for complete search history.

(56) References Cited

U.S. PATENT DOCUMENTS

| 7,696,067 | B2 * | 4/2010 | Nakamura | ......... B23K 26/0853 |
| | | | | 257/E21.599 |
| 9,105,708 | B2 * | 8/2015 | Uchida | .................... H01L 21/78 |
| 9,165,832 | B1 * | 10/2015 | Papanu | .................... H01L 21/78 |
| 2007/0190749 | A1 * | 8/2007 | Yoshikawa | .............. H01L 21/78 |
| | | | | 438/460 |

FOREIGN PATENT DOCUMENTS

JP           2005-064231           3/2005

* cited by examiner

*Primary Examiner* — Savitr Mulpuri
(74) *Attorney, Agent, or Firm* — Greer Burns & Crain, Ltd.

(57) ABSTRACT

A wafer has a substrate, a functional layer and division lines. The wafer is held on a chuck table with a protective member attached to the front side of the functional layer in contact with the chuck table. The height of the back side of the wafer is detected in a Z direction along each division line while moving the chuck table in an X direction. An X coordinate is recorded for each division line, as well as a corresponding Z coordinate. A cutting blade is positioned on the back side of the wafer and moved in the Z direction according to the recorded X and Z coordinates while moving the chuck table in the X direction to thereby form a cut groove having a depth not reaching the functional layer, with a part of the substrate left between the bottom of the cut groove and the functional layer.

2 Claims, 10 Drawing Sheets

FIG.7

Control map

| X coordinate | Height (Hmm) | Thickness (tmm) | Z coordinate (H-t+h)(mm) |
|---|---|---|---|
| X1 | 12.5 | 0.53 | 12.04 |
| X2 | 12.52 | 0.53 | 12.01 |
| X3 | 12.53 | 0.54 | 12.01 |
| X4 | 12.56 | 0.54 | 12.04 |
| X5 | 12.55 | 0.53 | 12.04 |
| X6 | 12.57 | 0.54 | 12.05 |
| ... | ... | ... | ... |
| Xn-1 | 12.58 | 0.55 | 12.05 |
| Xn | 12.56 | 0.54 | 12.04 |

WAFER PROCESSING METHOD

BACKGROUND OF THE INVENTION

1. Field of the Invention

The present invention relates to a wafer processing method for dividing a wafer into a plurality of individual devices along a plurality of crossing division lines, the wafer being composed of a substrate and a functional layer formed on the front side of the substrate, the division lines being formed on the front side of the functional layer to thereby define a plurality of separate regions where the devices are respectively formed.

2. Description of the Related Art

As well known in the art, in a semiconductor device fabrication process, a functional layer composed of an insulating film and a functional film is formed on the front side of a substrate such as a silicon substrate, and a plurality of devices such as ICs and LSIs are formed like a matrix from this functional layer, thus obtaining a semiconductor wafer having the plural devices. The functional layer is partitioned into the plural devices by a plurality of crossing division lines formed on the front side of the semiconductor wafer. The semiconductor wafer is divided along these division lines to obtain the individual devices as chips.

In recent years, a semiconductor wafer intended to improve the processing performance of semiconductor chips (devices) such as ICs and LSIs has been put into practical use. This semiconductor wafer is composed of a substrate such as a silicon substrate and a functional layer formed on the front side of the substrate, wherein the functional layer is composed of a low-permittivity insulator film (low-k film) and a functional film formed on the low-k film, the functional film forming a plurality of circuits. Thus, the semiconductor devices are formed from the functional layer. The low-k film is formed from an inorganic film of SiOF, BSG (SiOB), etc. or an organic film such as a polymer film of polyimide, parylene, etc.

Division of such a semiconductor wafer along the division lines is usually performed by using a cutting apparatus called a dicing saw. This cutting apparatus includes a chuck table for holding the semiconductor wafer as a workpiece, cutting means for cutting the semiconductor wafer held on the chuck table, and moving means for relatively moving the chuck table and the cutting means. The cutting means includes a rotating spindle adapted to be rotated at high speeds and a cutting blade mounted on the rotating spindle. The cutting blade is composed of a disk-shaped base and an annular cutting edge mounted on one side surface of the base along the outer circumference thereof. The annular cutting edge is an electroformed diamond blade formed by bonding diamond abrasive grains having a grain size of about 3 μm, for example. The cutting edge has a thickness of about 30 μm, for example.

However, it is difficult to cut the low-k film by using the cutting blade. That is, the low-k film is very brittle like mica. Accordingly, when the semiconductor wafer having the low-k film is cut along the division lines by using the cutting blade, there arises a problem such that the low-k film may be separated and this separation (delamination) may reach the devices (circuits) to cause fatal damage to the devices.

To solve this problem, Japanese Patent Laid-Open No. 2005-64231 discloses a wafer dividing method including the steps of applying a laser beam along both sides of each division line on a semiconductor wafer to form two laser processed grooves along each division line, thereby dividing the functional layer, and next positioning a cutting blade between the inner side walls of the two laser processed grooves along each division line to relatively move the cutting blade and the semiconductor wafer, thereby cutting the semiconductor wafer along each division line.

SUMMARY OF THE INVENTION

In the wafer processing method disclosed in Japanese Patent Laid-Open No. 2005-64231 mentioned above, a laser beam is applied along both sides of each division line formed on the semiconductor wafer to thereby form the two laser processed grooves dividing the functional layer along each division line. Thereafter, the cutting blade is positioned between the inner side walls of the two laser processed grooves along each division line and then operated to cut the semiconductor wafer along each division line. Accordingly, this conventional method has the following problems.

(1) At least two laser processed grooves must be formed along each division line to divide the functional layer in the condition where the spacing between the two laser processed grooves is larger than the width of the cutting blade. Accordingly, the productivity is reduced.

(2) When the division of the functional layer in forming the laser processed grooves is insufficient, the cutting blade may be deviated or tilted or uneven wearing of the cutting blade may occur.

(3) When the laser beam is applied to the wafer from the front side thereof to form the laser processed grooves, debris scatters and sticks to the front side of the wafer. Accordingly, a protective film must be formed on the front side of the wafer.

(4) To form the two laser processed grooves along each division line, the laser beam is applied in two passes along each division line. As a result, thermal strain remains in the wafer to cause a reduction in die strength of each device.

(5) Since the spacing between the two laser processed grooves along each division line is larger than the width of the cutting blade, the width of each division line must be increased to cause a decrease in number of devices that can be formed on the wafer.

(6) A passivation film of $SiO_2$, SiN, etc. is formed on the front side of the functional layer. Accordingly, when a laser beam is applied to the wafer from the front side thereof, the laser beam passes through the passivation film to reach the inside the functional layer. As a result, the energy of the laser beam is temporarily confined in the functional layer by the passivation film, so that there is a possibility of so-called undercut such that the processing by the laser beam may spread to the functional layer in each device where the circuits are formed and the density is low.

It is therefore an object of the present invention to provide a wafer processing method which can divide a wafer into a plurality of individual devices along a plurality of crossing division lines without the above problems, wherein the wafer includes a substrate and a functional layer formed on the front side of the substrate, and the division lines are formed on the front side of the functional layer to thereby define a plurality of separate regions where the devices are respectively formed.

In accordance with an aspect of the present invention, there is provided a wafer processing method dividing a wafer into a plurality of individual devices along a plurality of crossing division lines, the wafer being composed of a substrate and a functional layer formed on a front side of the substrate, the division lines being formed on a front side of the functional layer to thereby define a plurality of separate regions where the devices are respectively formed, the wafer processing method including a protective member attaching step of attaching a protective member to the front side of the functional layer of the wafer; a height recording step of holding the wafer on a chuck table in a condition where the protective member is in contact with the chuck table after performing the protective member attaching step, detecting a height of a back side of the wafer held on the chuck table in a Z direction in an area corresponding to each division line as moving the chuck table in an X direction, and recording an X coordinate on each division line and a Z coordinate corresponding to the X coordinate; a cut groove forming step of positioning a cutting blade on a back side of the substrate of the wafer in the area corresponding to each division line after performing the height recording step and relatively moving the chuck table and the cutting blade in the X direction to thereby form a cut groove having a depth not reaching the functional layer with a part of the substrate left between a bottom of the cut groove and the functional layer; and a laser processing step of applying a laser beam to the wafer from the back side thereof along the bottom of the cut groove after performing the cut groove forming step, thereby dividing the wafer along each division line. The cut groove forming step moves the cutting blade in the Z direction according to the X coordinate and the Z coordinate recorded in the height recording step to thereby make a thickness (h) of the part of the substrate left between the bottom of the cut groove and the functional layer uniform in the X direction.

Preferably, the height recording step includes a height measuring step of measuring a height (H) of the back side of the wafer held on the chuck table by using height measuring means, a thickness measuring step of measuring a thickness (t) of the wafer by using thickness measuring means, and a Z coordinate calculating step of calculating a height (H−t) of the front side of the wafer in the area corresponding to each division line according to the height (H) and the thickness (t) and adding the uniform thickness (h) to the height (H−t) to obtain a Z coordinate (H−t+h) where an outer circumference of the cutting blade is to be positioned.

Preferably, the height recording step is performed at the same X coordinate as the X coordinate where the cutting blade is to be positioned in the cut groove forming step.

The wafer processing method according to the present invention can exhibit the following effects.

(1) It is unnecessary to form a plurality of laser processed grooves for dividing the functional layer along each division line, so that the productivity can be improved.

(2) No laser processed groove is formed in the functional layer before cutting the substrate with the cutting blade. Accordingly, there is no possibility that the cutting blade may be deviated or tilted and there is no possibility of uneven wearing of the cutting blade.

(3) Since the laser beam is not applied from the front side of the wafer, a protective film for covering the front side of the wafer is not required.

(4) Since the laser beam is applied along the bottom of each cut groove, the energy of the laser beam applied is small and no thermal strain remains in the wafer, so that the die strength of each device is not reduced.

(5) Since the cut groove is formed on the back side of the substrate along each division line, it is unnecessary to increase the width of each division line, so that the number of devices that can be formed on the wafer can be increased.

(6) Since the laser beam is not applied from the front side of the wafer, there is no possibility that the laser beam may pass through the passivation film to process the functional layer and the heat generated in the functional layer may be temporarily confined by the passivation film to cause the delamination of the functional layer in each device.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 7 is a control map relating to a Z coordinate (H−t+h) where the outer circumference of a cutting blade is to be positioned, the Z coordinate corresponding to an X position (X coordinate) on the front side of the wafer along each division line;

DETAILED DESCRIPTION OF THE PREFERRED EMBODIMENT

Figure 1A:
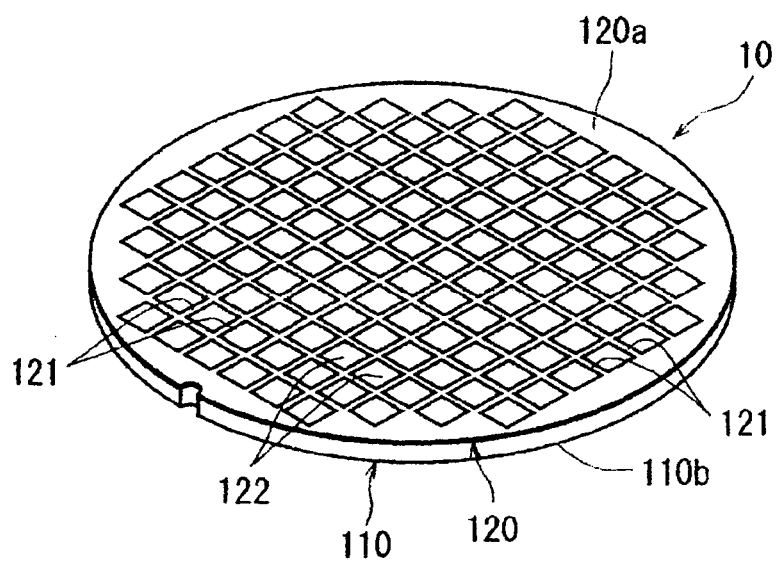
FIG. 1A is a perspective view of a semiconductor wafer.
Figure 1B:
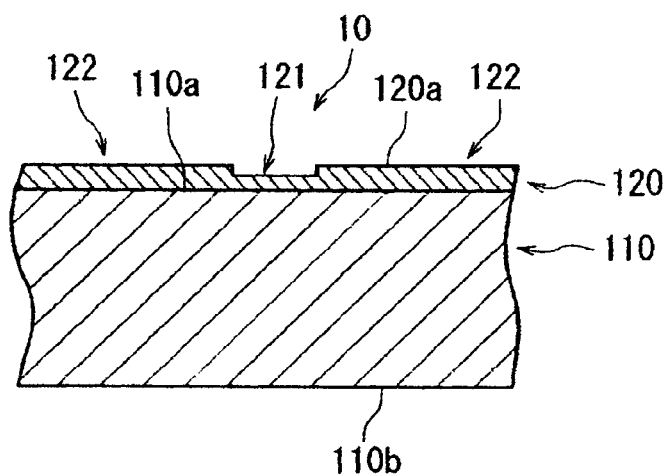
FIG. 1B is an enlarged sectional view of an essential part of the semiconductor wafer shown in FIG. 1A.

The wafer processing method according to the present invention will now be described in more detail with reference to the attached drawings. Referring to FIGS. 1A and 1B, there is shown a semiconductor wafer 10. The semiconductor wafer 10 is composed of a substrate 110 such as a silicon substrate and a functional layer 120 formed on the front side 110a of the substrate 110. For example, the substrate 110 has a thickness of 140 μm. The functional layer 120 is composed of an insulating film and a functional film formed on the insulating film, the functional film forming a plurality of circuits. A plurality of crossing division lines 121 are formed on a front side 120a of the functional layer 120 to thereby define a plurality of separate regions where a plurality of devices 122 such as ICs and LSIs are respectively formed. In this preferred embodiment, the insulating film constituting the functional layer 120 is provided by an $SiO_2$ film or a low-permittivity insulator film (low-k film). Examples of the low-k film include an inorganic film of SiOF, BSG (SiOB), etc. and an organic film such as a polymer film of polyimide, parylene, etc. For example, the thickness of the functional layer 120 is set to 10 μm. A passivation film of $SiO_2$, SiN, etc. is formed on the front side 120a of the functional layer 120.

Figure 2A:
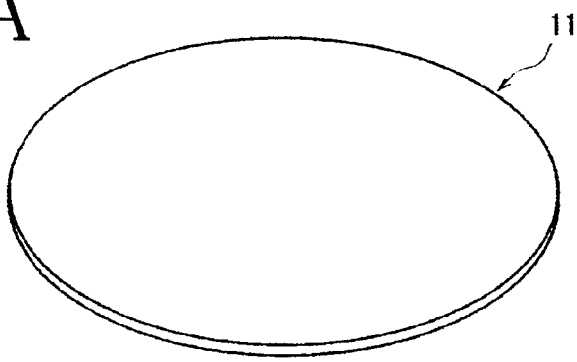
FIGS. 2A and 2B are perspective views for illustrating a protective member attaching step.
Figure 2A:
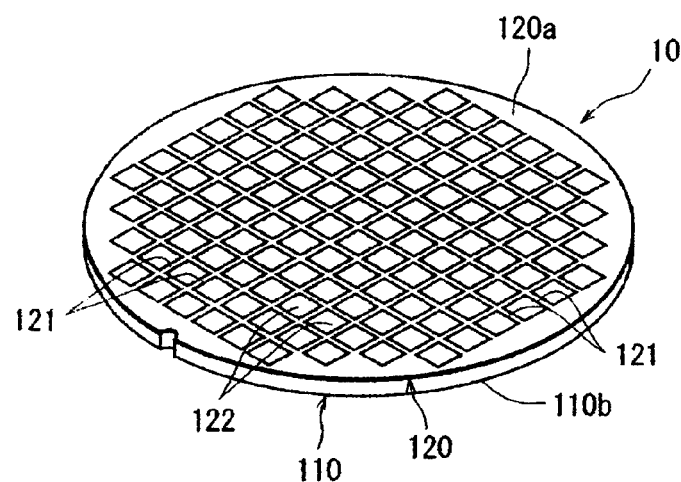
Figure 2B:
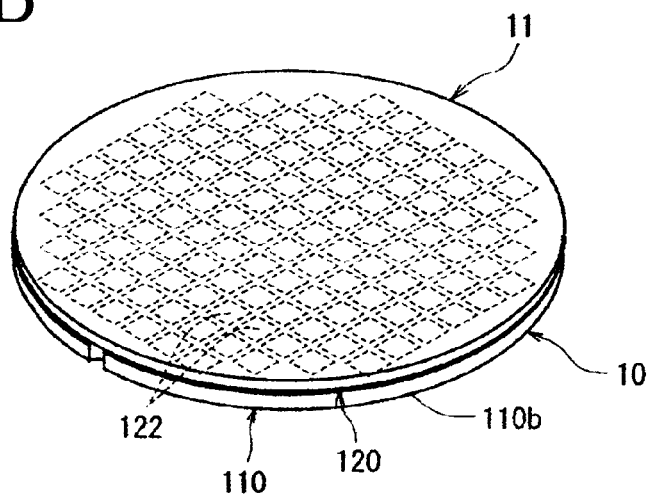

The wafer processing method for dividing the semiconductor wafer 10 along the division lines 121 will now be described. First, as shown in FIGS. 2A and 2B, a protective member 11 for protecting the devices 122 is attached to the front side 120a of the functional layer 120 formed on the substrate 110 of the semiconductor wafer 10 (protective member attaching step). Examples of the protective member 11 include a resin sheet such as a polyethylene film and a hard plate having rigidity such as a glass substrate.

Figure 3:
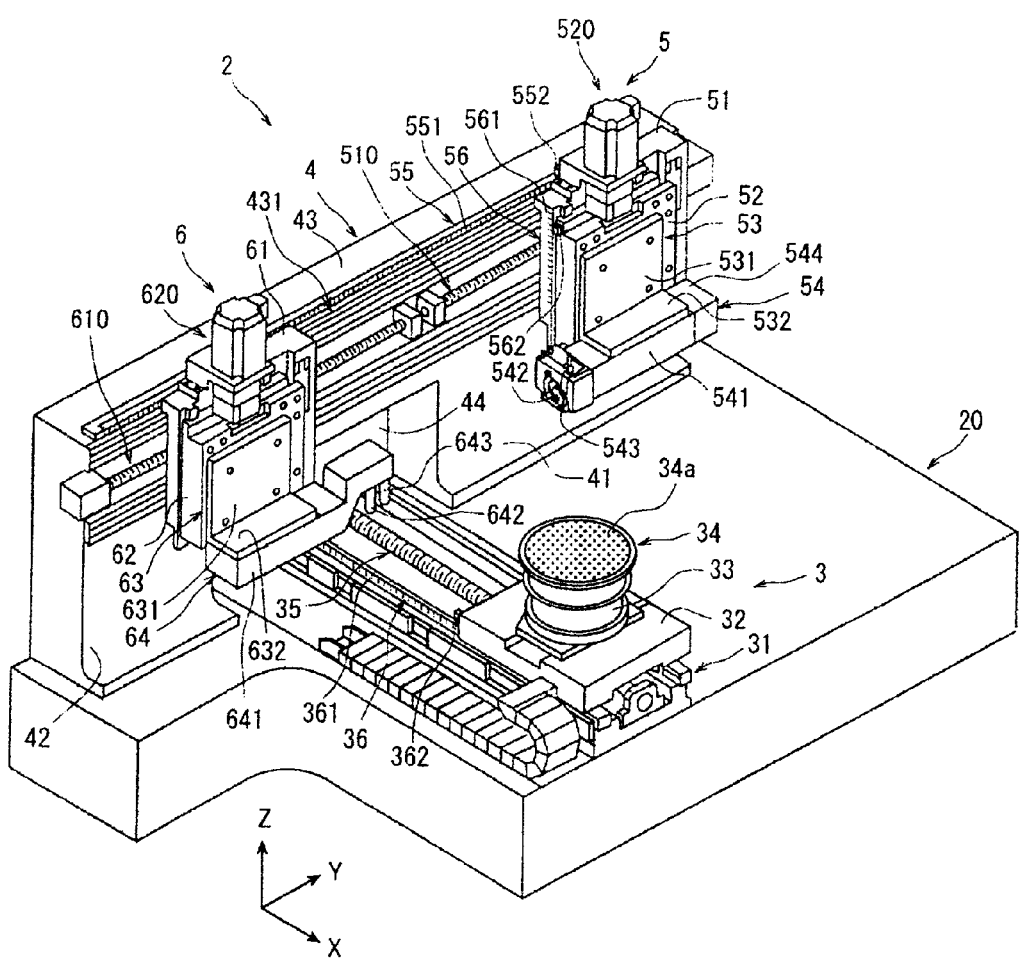
FIG. 3 is a perspective view of a cutting apparatus for performing a cut groove forming step.

After performing the protective member attaching step, a cut groove forming step is performed in such a manner that the semiconductor wafer 10 is held on a chuck table in the condition where the protective member 11 is in contact with the chuck table and a cutting blade is positioned on a back side 110b of the substrate 110 of the semiconductor wafer 10 in the area corresponding to each division line 121 to form a cut groove having a depth not reaching the functional layer 120 with a part of the substrate 110 left between the bottom of the cut groove and the functional layer 120. This cut groove forming step is performed by using a cutting apparatus 2 shown in FIG. 3. The cutting apparatus 2 shown in FIG. 3 includes a stationary base 20. There is provided on the stationary base 20 a chuck table mechanism 3 for holding a workpiece and moving it in a feeding direction (X direction) shown by an arrow X in FIG. 3.

The chuck table mechanism 3 includes a pair of guide rails 31 provided on the upper surface of the stationary base 20 so as to extend in the X direction. A support block 32 is provided on the guide rails 31 so as to be movable along the guide rails 31. A cylindrical member 33 is provided on the support block 32, and a chuck table 34 having a holding surface 34a as workpiece holding means is rotatably provided on the upper end of the cylindrical member 33. The workpiece placed on the holding surface 34a of the chuck table 34 is adapted to be held under suction by operating suction means (not shown). The chuck table 34 is adapted to be suitably rotated by a pulse motor (not shown) provided in the cylindrical member 33.

Referring again to FIG. 3, the chuck table mechanism 3 further includes feeding means 35 for moving the chuck table 34 in the X direction along the guide rails 31. The feeding means 35 is provided by a ball screw mechanism known in the art.

The cutting apparatus 2 includes X position detecting means 36 for detecting the X position of the chuck table 34. The X position detecting means 36 includes a linear scale 361 extending along one of the guide rails 31 and a read head 362 provided on the support block 32 and movable along the linear scale 361 together with the support block 32. The read head 362 of the X position detecting means 36 transmits a pulse signal of one pulse every 1 μm in this preferred embodiment to control means which will be hereinafter described. This control means counts the number of pulses as the pulse signal input from the read head 362 to thereby detect the X position of the chuck table 34.

The cutting apparatus 2 include a double column type support frame 4 provided on the stationary base 20 so as to straddle the guide rails 31. The double column type support frame 4 is composed of a first column portion 41, a second column portion 42, and a support portion 43 connecting the upper end of the first column portion 41 and the upper end of the second column portion 42 so as to extend in an indexing direction (Y direction) shown by an arrow Y in FIG. 3, the Y direction being perpendicular to the X direction. An opening 44 for allowing the movement of the chuck table 34 is formed between the first column portion 41 and the second column portion 42 below the support portion 43. A pair of guide rails 431 are provided on one side surface of the support portion 43 so as to extend in the Y direction.

The cutting apparatus 2 includes cutting means 5 movably provided on the guide rails 431 of the support portion 43 of the support frame 4 so as to be moved along the guide rails 431. The cutting means 5 includes an indexing block 51, a cutting block 52 supported to the indexing block 51 so as to be movable in a cutting direction (Z direction) shown by an arrow Z in FIG. 3, a spindle unit supporting member 53 mounted on the cutting block 52, and a spindle unit 54 mounted on the spindle unit supporting member 53. The indexing block 51 is movable in the Y direction along the guide rails 431 by indexing means 510 provided by a known ball screw mechanism. The cutting block 52 is movable in the Z direction along guide grooves (not shown) formed on the indexing block 51 by cutting block moving means 520 provided by a known ball screw mechanism. The spindle unit supporting member 53 is composed of a vertical portion 531 and a horizontal portion 532 horizontally extending from the lower end of the vertical portion 531. The vertical portion 531 is mounted on the cutting block 52. The spindle unit 54 is mounted on the lower surface of the horizontal portion 532 of the spindle unit supporting member 53.

The spindle unit 54 includes a spindle housing 541, a rotating spindle 542 rotatably supported to the spindle housing 541, a cutting blade 543 mounted on one end of the rotating spindle 542, and a servo motor 544 for rotationally driving the rotating spindle 542. The axis of rotation of the rotating spindle 542 extends in the Y direction.

The cutting apparatus 2 includes Y position detecting means 55 for detecting the Y position of the cutting means 5. The Y position detecting means 55 includes a linear scale 551 extending along one of the guide rails 431 and a read head 552 provided on the indexing block 51 and movable along the linear scale 551 together with the indexing block 51. The read head 552 of the Y position detecting means 55 transmits a pulse signal of one pulse every 1 μm in this preferred embodiment to the control means. The control means counts the number of pulses as the pulse signal input from the read head 552 to thereby detect the Y position of the cutting means 5.

The cutting apparatus 2 further includes Z position detecting means 56 for detecting the Z position of the spindle unit supporting member 53 on which the spindle unit 54 is mounted. The Z position detecting means 56 includes a linear scale 561 provided on one side surface of the indexing block 51 so as to extend in the Z direction and a read head 562 provided on the spindle unit supporting member 53 and movable along the linear scale 561 together with the spindle unit supporting member 53. The read head 562 of the Z position detecting means 56 transmits a pulse signal of one pulse every 1 μm in this preferred embodiment to the control means. The control means counts the number of pulses as the pulse signal input from the read head 562 to thereby detect the Z position of the spindle unit 54.

The cutting apparatus 2 further includes measuring means 6 movably provided on the guide rails 431 of the support portion 43 of the support frame 4 so as to be moved along the guide rails 431. The measuring means 6 includes a Y moving block 61, a Z moving block 62 supported to the Y moving block 61 so as to be movable in the Z direction, a measuring unit supporting member 63 mounted on the Z moving block 62, and a measuring unit 64 mounted on the measuring unit supporting member 63. The Y moving block 61 is movable in the Y direction along the guide rails 431 by Y moving means 610 provided by a known ball screw mechanism. The Z moving block 62 is movable in the Z direction along guide grooves (not shown) formed on the Y moving block 61 by Z moving means 620 provided by a known ball screw mechanism. The measuring unit supporting member 63 is composed of a vertical portion 631 and a horizontal portion 632 horizontally extending from the lower end of the vertical portion 631. The vertical portion 631 is mounted on the Z moving block 62. The measuring unit 64 is mounted on the lower surface of the horizontal portion 632 of the measuring unit supporting member 63.

The measuring unit 64 includes a unit housing 641, height measuring means 642 provided on the unit housing 641, and thickness measuring means 643 provided on the unit housing 641 in the vicinity of the height measuring means 642. The height measuring means 642 may be provided by the height measuring means described in Japanese Patent Laid-Open No. 2009-262219, for example. Other examples of the height measuring means 642 include a laser displacement gauge, back pressure sensor, and microgauge. The thickness measuring means 643 may be provided by the thickness measuring means disclosed in Japanese Patent Laid-Open No. 2006-38744, for example. Other examples of the thickness measuring means 643 include an ultrasonic thickness gauge and a laser interferometer.

Figure 4:
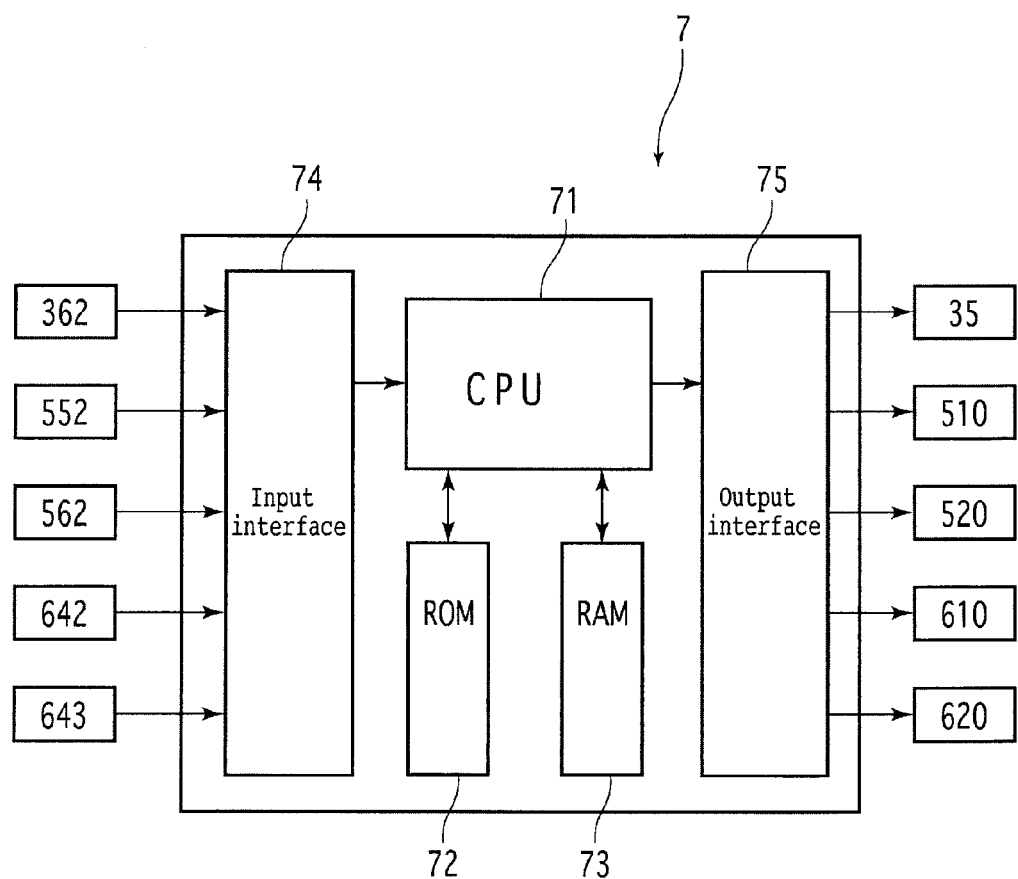
FIG. 4 is a block diagram of control means installed in the cutting apparatus shown in FIG. 3.

The cutting apparatus 2 includes control means 7 shown in FIG. 4. The control means 7 is configured by a computer, and it includes a central processing unit (CPU) 71 for performing operational processing according to a control program, a read only memory (ROM) 72 preliminarily storing the control program, a random access memory (RAM) 73 for storing the results of computation, etc., an input interface 74, and an output interface 75. Detection signals from the read head 362 of the X position detecting means 36, the read head 552 of the Y position detecting means 55, the read head 562 of the Z position detecting means 56, the height measuring means 642, and the thickness measuring means 643 are input into the input interface 74 of the control means 7. On the other hand, control signals are output from the output interface 75 of the control means 7 to the feeding means 35, the indexing means 510, the cutting block moving means 520, the Y moving means 610, and the Z moving means 620.

The cut groove forming step using the cutting apparatus 2 mentioned above will now be described, wherein the cutting blade 543 is positioned on the back side 110b of the substrate 110 of the semiconductor wafer 10 in the area corresponding to each division line 121 to form a cut groove in this area, the cut groove having a depth not reaching the functional layer 120 with a part of the substrate 110 left between the bottom of the cut groove and the functional layer 120. First, the semiconductor wafer 10 is placed on the chuck table 34 of the cutting apparatus 2 shown in FIG. 3 in the condition where the protective member 11 attached to the front side 120a of the functional layer 120 formed on the substrate 110 as shown in FIGS. 2A and 2B is in contact with the upper surface of the chuck table 34. Thereafter, the suction means (not shown) connected to the chuck table 34 is operated to hold the semiconductor wafer 10 through the protective member 11 on the chuck table 34 under suction. Accordingly, the semiconductor wafer 10 is held on the chuck table 34 in the condition where the back side 110b of the substrate 110 is oriented upward. After thus holding the semiconductor wafer 10 through the protective member 11 on the chuck table 34 under suction, a known alignment operation is performed to thereby make the division lines 121 extending in a first direction parallel to the X direction.

Figure 5A:
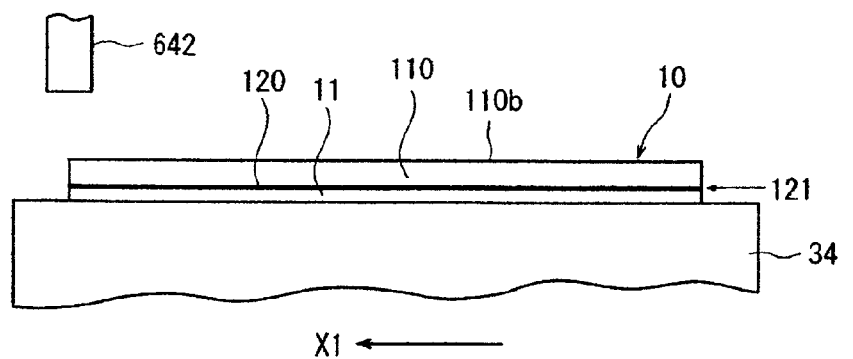
FIGS. 5A and 5B are side views for illustrating a height measuring step.
Figure 5B:
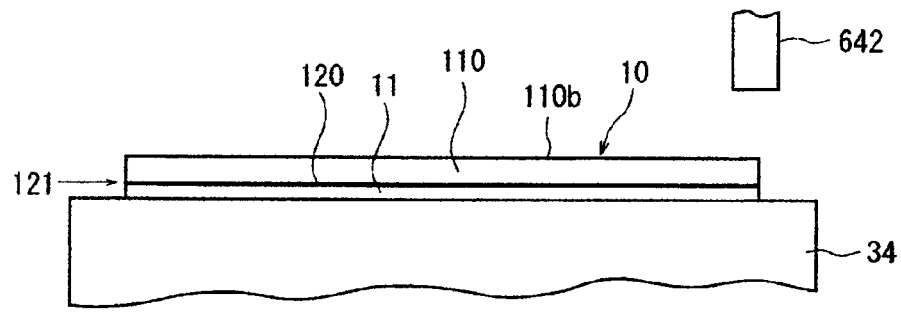

Thereafter, the chuck table 34 holding the semiconductor wafer 10 is moved to a working area. At this time, the measuring means 6 is positioned at the working area. As shown in FIG. 5A, the area corresponding to a predetermined one of the division lines 121 extending in the first direction is positioned directly below the height measuring means 642 of the measuring means 6. At this time, one end (left end as viewed in FIG. 5A) of the area corresponding to the predetermined division line 121 is positioned directly below the height measuring means 642 as shown in FIG. 5A. Thereafter, the height measuring means 642 is operated and the feeding means 35 is operated to move the chuck table 34 in the direction shown by an arrow X1 in FIG. 5A. When the other end (right end as viewed in FIG. 5B) of the area corresponding to the predetermined division line 121 reaches the position directly below the height measuring means 642 as shown in FIG. 5B, the operation of the feeding means 35 is stopped and the operation of the height measuring means 642 is also stopped (height measuring step). By performing this height measuring step, the height (H) of the back side 110b of the substrate 110 in the area corresponding to the predetermined division line 121 of the semiconductor wafer 10 held on the chuck table 34 is detected by the height measuring means 642. A height signal indicating the height (H) detected above is transmitted from the height measuring means 642 to the control means 7. At this time, a detection signal indicating the X position of the chuck table 34 is transmitted from the X position detecting means 36 to the control means 7. The height (H) corresponding to the X position is stored into the random access memory (RAM) 73 of the control means 7. The height measuring step mentioned above is similarly performed for the areas corresponding to all of the other division lines 121 of the semiconductor wafer 10.

Figure 6A:
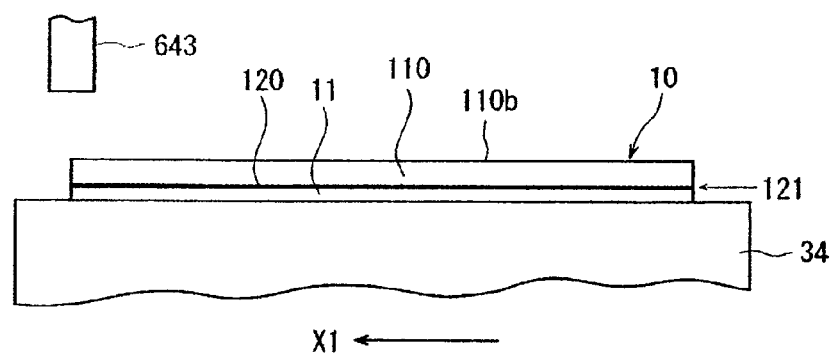
FIGS. 6A and 6B are side views for illustrating a thickness measuring step.
Figure 6B:
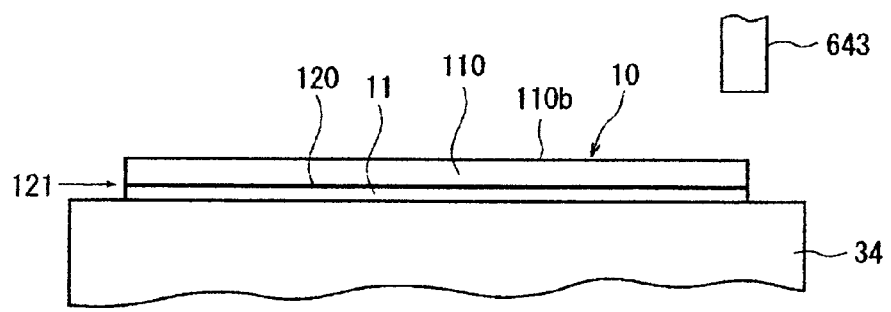

After performing the height measuring step mentioned above, the area corresponding to the predetermined division line 121 of the semiconductor wafer 10 held on the chuck table 34 is positioned directly below the thickness measuring means 643 of the measuring means 6 as shown in FIG. 6A. At this time, one end (left end as viewed in FIG. 6A) of the area corresponding to the predetermined division line 121 is positioned directly below the thickness measuring means 643 as shown in FIG. 6A. Thereafter, the thickness measuring means 643 is operated and the feeding means 35 is operated to move the chuck table 34 in the direction shown by an arrow X1 in FIG. 6A. When the other end (right end as viewed in FIG. 6B) of the area corresponding to the predetermined division line 121 reaches the position directly below the thickness measuring means 643, the operation of the feeding means 35 is stopped and the operation of the thickness measuring means 643 is also stopped (thickness measuring step). By performing this thickness measuring step, the thickness (t) of the area corresponding to the predetermined division line 121 of the semiconductor wafer 10 held on the chuck table 34 is detected by the thickness measuring means 643. A thickness signal indicating the thickness (t) detected above is transmitted from the thickness measuring means 643 to the control means 7. At this time, a detection signal indicating the X position of the chuck table 34 is transmitted from the X position detecting means 36 to the control means 7. The thickness (t) corresponding to the X position is stored into the random access memory (RAM) 73 of the control means 7. The thickness measuring step mentioned above is similarly performed for the areas corresponding to all of the other division lines 121 of the semiconductor wafer 10.

After performing the height measuring step and the thickness measuring step as mentioned above, a Z coordinate calculating step is performed in such a manner that the height of the front side 110a of the substrate 110 in the area corresponding to each division line 121 in the Z direction is calculated according to the height (H) and the thickness (t) stored in the random access memory (RAM) 73 of the control means 7 (height in the Z direction=H−t) and a uniform thickness (h) as the thickness of a part of the substrate 10 to be left between the bottom of the cut groove and the functional layer 120 is next added to the height (H−t) calculated above, thereby calculating a Z coordinate where the outer circumference (lower end) of the cutting blade 543 is to be positioned (Z coordinate=H−t+h). The lower end of the cutting blade 543 is set at a vertical position not reaching the functional layer 120

(e.g., at a height of 10 μm from the front side 110a of the substrate 10 toward the back side 110b thereof).

Accordingly, the Z coordinate where the outer circumference (lower end) of the cutting blade 543 is to be positioned is calculated as a height of 20 μm from the front side 120a of the functional layer 120 having a thickness of 10 μm toward the back side 110b of the substrate 110. After calculating the height (H−t) of the front side 110a of the substrate 110 in the area corresponding to each division line 121 in the Z direction according to the height (H) and the thickness (t) stored in the random access memory (RAM) 73 and next adding the uniform thickness (h) of a part of the substrate 110 to thereby obtain the Z coordinate (H−t+h) where the outer circumference (lower end) of the cutting blade 543 is to be positioned, the control means 7 prepares a control map for each division line 121 as shown in FIG. 7, wherein the values for the Z coordinate (H−t+h) for positioning the outer circumference (lower end) of the cutting blade 543 respectively correspond to the values for the X position (X coordinate) on the front side of the area corresponding to each division line 121. The control map thus prepared is stored into the random access memory (RAM) 73.

The height measuring step, the thickness measuring step, and the Z coordinate calculating step constitute a height recording step of recording the X coordinate on each division line 121 and the Z coordinate corresponding to the X coordinate. After performing the height recording step mentioned above, a cut groove forming step is performed in such a manner that the cutting blade 543 is positioned on the back side 110b of the substrate 110 of the semiconductor wafer 10 in the area corresponding to each division line 121, and the chuck table 34 and the cutting blade 543 are relatively moved in the X direction to thereby form a cut groove in this area, the cut groove having a depth not reaching the functional layer 120 with a part of the substrate 110 left between the bottom of the cut groove and the functional layer 120.

In performing the cut groove forming step, the control means 7 moves the measuring means 6 from the working area to a retracted position and then moves the cutting means 5 to the working area. Thereafter, the control means 7 operates the feeding means 35 to move the chuck table 34 holding the semiconductor wafer 10 to a cut start position in the working area. At this time, as shown in FIG. 8A, one end (left end as viewed in FIG. 8A) of the area corresponding to the predetermined division line 121 is positioned on the right side of a position directly below the cutting blade 543 by a predetermined amount.

Figure 8A:
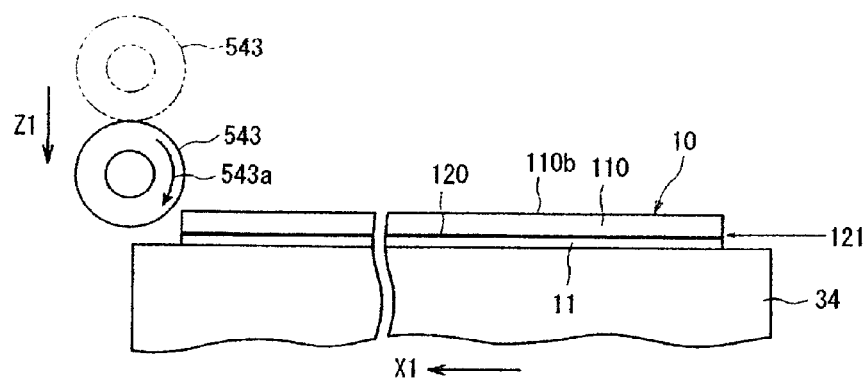
FIGS. 8A to 8D are views for illustrating the cut groove forming step.
Figure 8B:
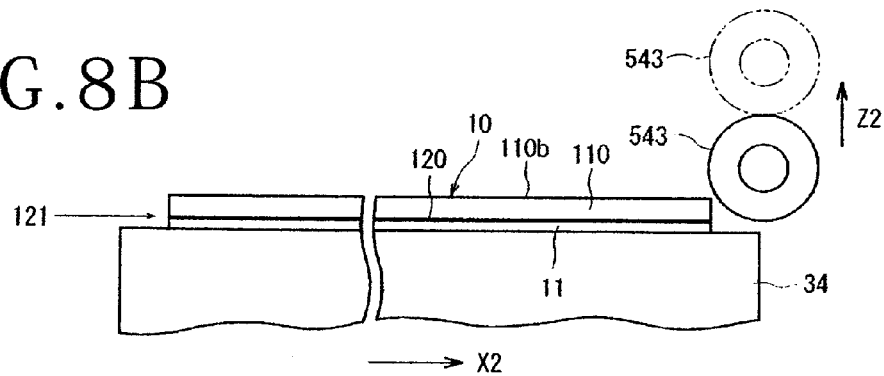
Figures 8C, 8D:
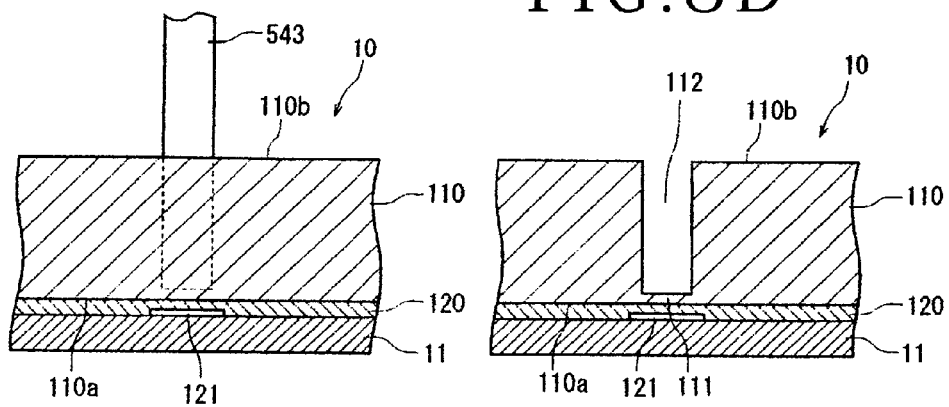

In the condition where the chuck table 34 is set at the cut start position in the working area as described above, the cutting blade 543 is lowered from a standby position shown by a phantom line in FIG. 8A to a working position shown by a solid line in FIG. 8A as shown by an arrow Z1 in FIG. 8A. This working position is shown by a broken line in FIG. 8C. As shown in FIGS. 8A and 8C, this working position is set at the Z coordinate (H−t+h) calculated in the height recording step mentioned above (e.g., at a height of 10 μm from the front side 110a of the substrate 110 toward the back side 110b thereof, in other words, at a height of 20 μm from the front side 120a of the functional layer 120 having a thickness of 10 μm toward the back side 110b of the substrate 110).

Thereafter, the cutting blade 543 is rotated in the direction shown by an arrow 543a in FIG. 8A at a predetermined rotational speed, and the chuck table 34 is moved in the direction shown by an arrow X1 in FIG. 8A at a predetermined feed speed. When the other end (right end as viewed in FIG. 8B) of the area corresponding to the predetermined division line 121 reaches a position on the left side of the position directly below the cutting blade 543 by a predetermined amount as shown in FIG. 8B, the movement of the chuck table 34 is stopped (cut groove forming step). In this cut groove forming step, the control means 7 controls the cutting block moving means 520 for moving the cutting block 52 (which supports the spindle unit supporting member 53 on which the spindle unit 54 having the cutting blade 543 is mounted) in the Z direction according to the detection signals from the X position detecting means 36 and the Z position detecting means 56 and the control map (FIG. 7) stored in the random access memory (RAM) 73 for setting the Z coordinate (H−t+h).

By controlling the cutting block moving means 520 according to the detection signals from the X position detecting means 36 and the Z position detecting means 56 and the control map (FIG. 7) for setting the Z coordinate (H−t+h), the substrate 110 of the semiconductor wafer 10 is cut in the area corresponding to the predetermined division line 121 by the cutting blade 543 to form a cut groove 112 having a depth not reaching the functional layer 120 with a part 111 of the substrate 110 left between the bottom of the cut groove 112 and the functional layer 120 as shown in FIG. 8D, wherein this part 111 has the uniform thickness (h) as previously mentioned (cut groove forming step). In this preferred embodiment, the working position of the cutting blade 543 (the lower end of the cutting blade 543) is set at a height of 20 μm from the front side 120a of the functional layer 120 having a thickness of 10 μm toward the back side 110b of the substrate 110. Accordingly, the cut groove 112 is formed on the back side 110b of the substrate 110 so as to leave the part 111 having a thickness of 10 μm between the bottom of the cut groove 112 and the functional layer 120. In particular, the height measuring step mentioned above is performed at the same X coordinate as the X coordinate where the cutting blade 543 is positioned in the cut groove forming step in the condition where the semiconductor wafer 10 is held on the chuck table 34. Accordingly, even when yawing of the chuck table 34 in the vertical direction (Z direction) occurs because of the structure of the feeding means 35 provided by a ball screw mechanism or there are variations in thickness of the protective member 11 attached to the front side 120a of the functional layer 120 formed on the substrate 110 of the semiconductor wafer 10, the cut groove 112 can be formed so as to have a depth not reaching the functional layer 120 with the part 111 of the substrate 110 left between the bottom of the cut groove 112 and the functional layer 120, this part 111 having a uniform thickness uniform in the X direction.

Thereafter, the control means 7 operates the cutting block moving means 520 to raise the cutting blade 543 from the working position to the standby position as shown by an arrow Z2 in FIG. 8B, and the control means 7 next operates the feeding means 35 to move the chuck table 34 in the direction shown by an arrow X2 in FIG. 8B to the position shown in FIG. 8A. Thereafter, the control means 7 operates the indexing means 510 to move the cutting blade 543 in the direction (indexing direction) perpendicular to the sheet plane of FIG. 8A by an amount corresponding to the pitch of the division lines 121, thereby aligning the cutting blade 543 with the area corresponding to the next division line 121. In the condition where the cutting blade 543 is aligned with the area corresponding to the next division line 121 as mentioned above, the cut groove forming step is performed similarly. In this manner, the cut groove forming step mentioned above is performed similarly along the areas corresponding to all of the division lines 121 of the semiconductor wafer 10.

For example, the cut groove forming step is performed under the following processing conditions.

Cutting blade: outer diameter 52 mm, thickness 40 µm
Rotational speed of the cutting blade: 30000 rpm
Work feed speed: 50 mm/second After performing the cut groove forming step mentioned above, a laser processing step is performed in such a manner that a laser beam is applied from the back side 110b of the substrate 110 of the semiconductor wafer 10 along the bottom of each cut groove 112, thereby dividing the semiconductor wafer 10 along each division line 121. This laser processing step is performed by using a laser processing apparatus 8 shown in FIG. 9. The laser processing apparatus 8 shown in FIG. 9 includes a chuck table 81 for holding a workpiece, laser beam applying means 82 for applying a laser beam to the workpiece held on the chuck table 81, and imaging means 83 for imaging the workpiece held on the chuck table 81. The chuck table 81 has an upper surface as a holding surface for holding the workpiece thereon under suction. The chuck table 81 is movable both in the feeding direction shown by an arrow X in FIG. 9 by feeding means (not shown) and in the indexing direction shown by an arrow Y in FIG. 9 by indexing means (not shown).

The laser beam applying means 82 includes a cylindrical casing 821 extending in a substantially horizontal direction. Although not shown, the casing 821 contains pulsed laser beam oscillating means including a pulsed laser beam oscillator and repetition frequency setting means. The laser beam applying means 82 further includes focusing means 822 mounted on the front end of the casing 821 for focusing a pulsed laser beam oscillated by the pulsed laser beam oscillating means. The laser beam applying means 82 further includes focal position adjusting means (not shown) for adjusting the focal position of the pulsed laser beam to be focused by the focusing means 822.

The imaging means 83 is mounted on a front end portion of the casing 821 constituting the laser beam applying means 82 and includes illuminating means for illuminating the workpiece, an optical system for capturing an area illuminated by the illuminating means, and an imaging device (CCD) for imaging the area captured by the optical system. An image signal output from the imaging means 83 is transmitted to control means (not shown).

Figure 9:
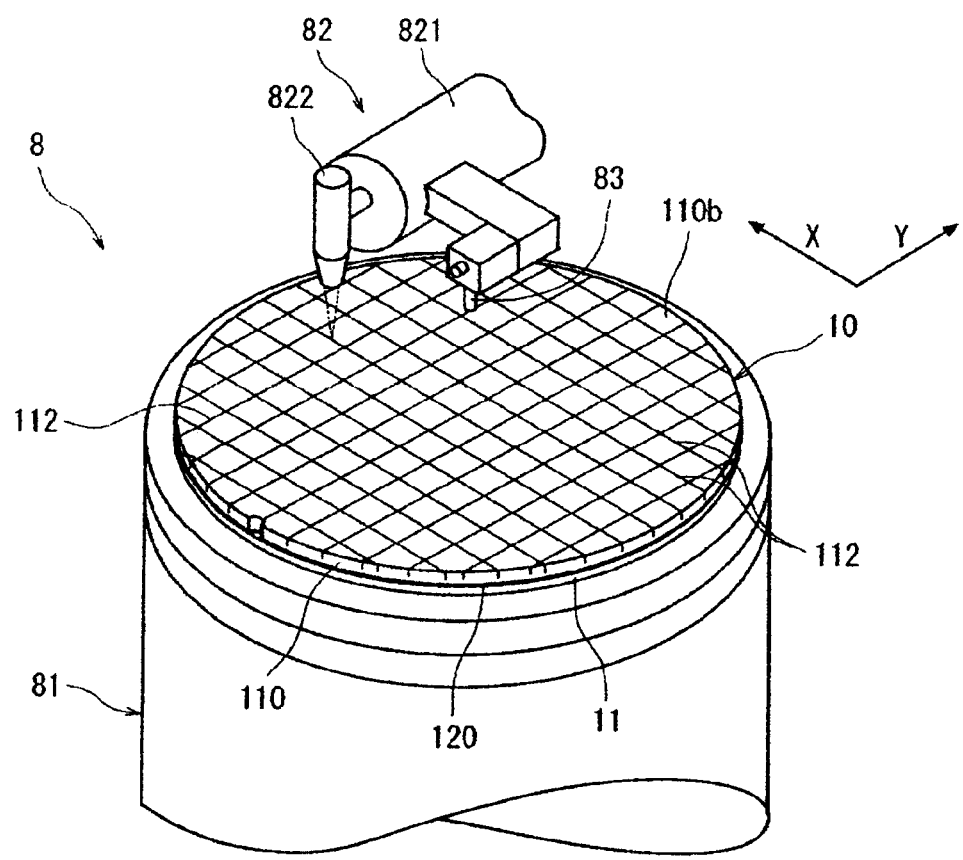
FIG. 9 is a perspective view showing an essential part of a laser processing apparatus for performing a laser processing step.

In performing the laser processing step of applying a laser beam from the back side 110b of the substrate 110 of the semiconductor wafer 10 along the bottom of each cut groove 112 by using the laser processing apparatus 8 mentioned above, thereby dividing the semiconductor wafer 10 along each division line 121, the semiconductor wafer 10 is first placed on the chuck table 81 of the laser processing apparatus 8 shown in FIG. 9 in the condition where the protective member 11 attached to the front side 120a of the functional layer 120 formed on the substrate 110 of the semiconductor wafer 10 is in contact with the upper surface of the chuck table 81 as shown in FIG. 9. Thereafter, suction means (not shown) is operated to hold the semiconductor wafer 10 through the protective member 11 on the chuck table 81 under suction (wafer holding step). Accordingly, the back side 110b of the substrate 110 of the semiconductor wafer 10 held on the chuck table 81 is oriented upward. Thereafter, the chuck table 81 holding the semiconductor wafer 10 is moved to a position directly below the imaging means 83 by operating the feeding means (not shown).

In the condition where the chuck table 81 is positioned directly below the imaging means 83, an alignment operation is performed by the imaging means 83 and the control means (not shown) to detect a subject area of the semiconductor wafer 10 to be laser-processed. More specifically, the imaging means 83 and the control means perform image processing such as pattern matching for making the alignment of the cut grooves 112 extending in a first direction and the focusing means 822 of the laser beam applying means 82 for applying the laser beam to the semiconductor wafer 10 along the cut grooves 112 from the back side 110b of the substrate 110, thus performing the alignment of a laser beam applying position (alignment step). Similarly, the alignment of a laser beam applying position is performed for the other cut grooves 112 extending in a second direction perpendicular to the first direction on the semiconductor wafer 10.

Figure 10A:
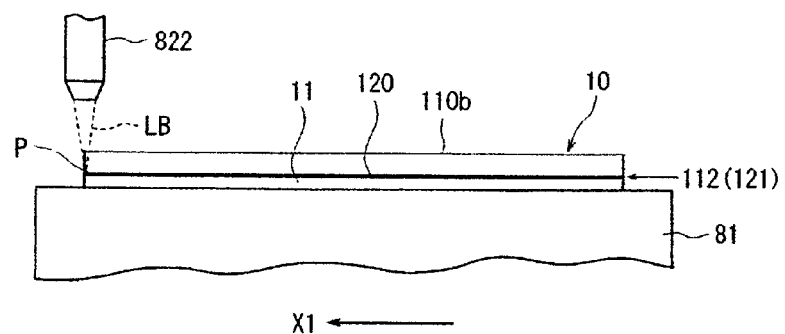
FIGS. 10A to 10D are views for illustrating the laser processing step.

After performing the alignment step mentioned above, the chuck table 81 is moved to a laser beam applying area where the focusing means 822 of the laser beam applying means 82 is located as shown in FIG. 10A, thereby positioning a predetermined one of the cut grooves 112 extending in the first direction directly below the focusing means 822. At this time, one end (left end as viewed in FIG. 10A) of the predetermined cut groove 112 is positioned directly below the focusing means 822 as shown in FIG. 10A. Further, the focal point P of a pulsed laser beam LB to be applied from the focusing means 822 is set near the bottom surface of the predetermined cut groove 112 as shown in FIG. 10C. Thereafter, the pulsed laser beam LB having an absorption wavelength to the substrate 10 and the functional layer 120 is applied from the focusing means 822 to the semiconductor wafer 10, and the chuck table 81 is moved in the direction shown by an arrow X1 in FIG. 10A at a predetermined feed speed. When the other end (right end as viewed in FIG. 10B) of the predetermined cut groove 112 reaches the position directly below the focusing means 822 as shown in FIG. 10B, the application of the pulsed laser beam LB is stopped and the movement of the chuck table 81 is also stopped (laser processing step).

Figure 10B:
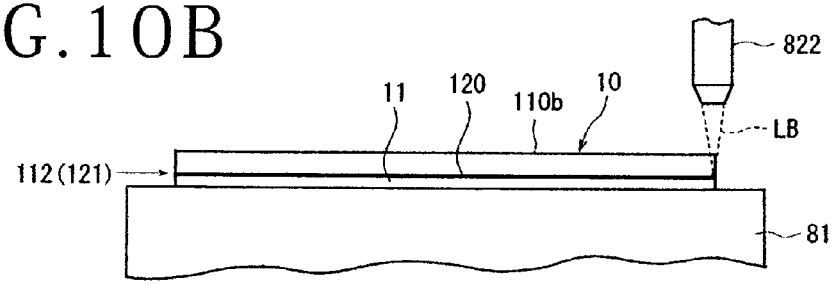
Figures 10C, 10D:
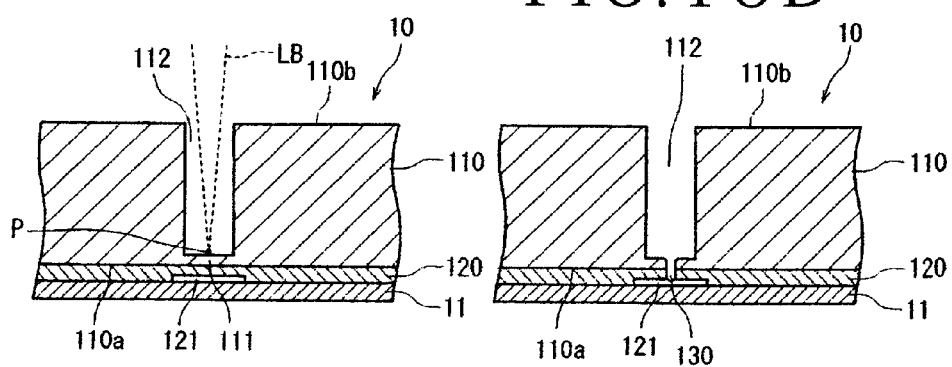

Thereafter, the chuck table 81 is moved in the direction (indexing direction) perpendicular to the sheet plane of FIG. 10B by the pitch of the cut grooves 112 (equivalent to the pitch of the division lines 121). Thereafter, the pulsed laser beam LB is applied from the focusing means 822 to the semiconductor wafer 10, and the chuck table 81 is moved in the direction shown by an arrow X2 in FIG. 10B at the predetermined feed speed, thereby applying the pulsed laser beam LB along the next cut groove 112 extending in the first direction. When the left end of the next cut groove 112 as viewed in FIG. 10B reaches the position directly below the focusing means 822, the application of the pulsed laser beam LB is stopped and the movement of the chuck table 81 is also stopped.

By performing the laser processing step mentioned above, a laser processed groove 130 is formed through the part 111 of the substrate 110 and the functional layer 120 of the semiconductor wafer 10 so as to extend along each cut groove 112 as shown in FIG. 10D. As a result, the part 111 of the substrate 110 and the functional layer 120 are divided by the laser processed groove 130. The part 111 of the substrate 110 left in the cut groove forming step has a uniform thickness uniform in the X direction as described above, so that the functional layer 120 can be uniformly divided by the application of the laser beam, thereby stabilizing the quality of each device.

For example, the laser processing step mentioned above is performed under the following processing conditions.
Wavelength of the laser beam: 355 nm
Repetition frequency: 200 kHz
Power: 1.5 W
Focused spot diameter: 10 µm
Work feed speed: 300 mm/second
Number of passes of the laser beam per division line: 1

After performing the laser processing step along the predetermined division line 121 and the next division line 121 as mentioned above, the chuck table 81 is moved in the indexing direction of the arrow Y in FIG. 9 by the pitch of the division lines 121 (indexing step) to similarly perform the laser processing step. After performing the laser processing step along all of the division lines 121 extending in the first direction, the chuck table 81 is rotated 90 degrees to similarly perform the laser processing step along the other division lines 121 extending in the second direction perpendicular to the first direction.

The laser processed groove 130 formed through the part 111 of the substrate 110 and the functional layer 120 along each division line 121 in the laser processing step has a width smaller than the width of the cut groove 112 formed in the substrate 110 along each division line 121. Accordingly, it is unnecessary to form a laser processed groove having a width larger than the width of the cutting blade 543, so that the width of each division line 121 can be reduced to thereby increase the number of devices that can be formed on the wafer.

Further, although the passivation film of $SiO_2$, SiN, etc. is formed on the front side 120a of the functional layer 120 in this preferred embodiment, the energy of the laser beam applied to the functional layer 120 along each division line 121 in the laser processing step can be relieved to the cut groove 112 formed on the back side 110b of the substrate 110 along each division line 121, so that the problem of so-called undercut can be solved.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method dividing a wafer into a plurality of individual devices along a plurality of crossing division lines, said wafer being composed of a substrate and a functional layer formed on a front side of said substrate, said division lines being formed on a front side of said functional layer to thereby define a plurality of separate regions where said devices are respectively formed, said wafer processing method comprising:

a protective member attaching step of attaching a protective member to the front side of said functional layer of said wafer;

a height recording step of holding said wafer on a chuck table in a condition where said protective member is in contact with said chuck table after performing said protective member attaching step, detecting a height of a back side of said wafer held on said chuck table in a Z direction in an area corresponding to each division line as moving said chuck table in an X direction, and recording an X coordinate on each division line and a Z coordinate corresponding to said X coordinate;

a cut groove forming step of positioning a cutting blade on a back side of said substrate of said wafer in the area corresponding to each division line after performing said height recording step and relatively moving said chuck table and said cutting blade in said X direction to thereby form a cut groove having a depth not reaching said functional layer with a part of said substrate left between a bottom of said cut groove and said functional layer; and a laser processing step of applying a laser beam to said wafer from the back side thereof along the bottom of said cut groove after performing said cut groove forming step, thereby dividing said wafer along each division line;

wherein said cut groove forming step moves said cutting blade in said Z direction according to said X coordinate and said Z coordinate recorded in said height recording step to thereby make a thickness (h) of said part of said substrate left between the bottom of said cut groove and said functional layer uniform in said X direction, wherein said height recording step includes: a height measuring step of measuring a height (H) of the back side of said wafer held on said chuck table by using height measuring means; a thickness measuring step of measuring a thickness (t) of said wafer by using thickness measuring means; and a Z coordinate calculating step of calculating a height (H−t) of the front side of said wafer in the area corresponding to each division line according to said height (H) and said thickness (t) and adding said uniform thickness (h) to said height (H−t) to obtain a Z coordinate (H−t+h) where an outer circumference of said cutting blade is to be positioned.

2. The wafer processing method according to claim 1, wherein said height recording step is performed at the same X coordinate as the X coordinate where said cutting blade is to be positioned in said cut groove forming step.

* * * * *